United States Patent [19]
Azuma et al.

[11] Patent Number: 5,879,863
[45] Date of Patent: Mar. 9, 1999

[54] PATTERN FORMING METHOD

[75] Inventors: Tsukasa Azuma, Tokyo; Masaki Narita; Katsuya Okumura, both of Yokohama, all of Japan

[73] Assignee: Kabushiki Kaisha Toshiba, Kawasaki, Japan

[21] Appl. No.: 787,390

[22] Filed: Jan. 22, 1997

[51] Int. Cl.$^6$ ............................................ G03F 7/00
[52] U.S. Cl. ...................... 430/322; 430/325; 430/327
[58] Field of Search .................. 430/271.1, 273.1, 430/311, 313, 322, 327, 325

[56] References Cited

U.S. PATENT DOCUMENTS

| | | | |
|---|---|---|---|
| 4,557,797 | 12/1985 | Fuller et al. | 156/643 |
| 4,946,758 | 8/1990 | Kurtz et al. | 430/259 |
| 5,019,485 | 5/1991 | Nakamura | 430/296 |
| 5,071,732 | 12/1991 | Köhler et al. | 430/272 |
| 5,110,697 | 5/1992 | Lamb, III et al. | 430/14 |
| 5,240,812 | 8/1993 | Conley | 430/273 |
| 5,324,550 | 6/1994 | Yamaguchi et al. | 427/510 |
| 5,326,675 | 7/1994 | Niki et al. | 430/326 |
| 5,369,061 | 11/1994 | Nagayama | 437/228 |
| 5,372,914 | 12/1994 | Naito et al. | 430/296 |
| 5,407,782 | 4/1995 | Kobayashi | 430/273 |
| 5,410,005 | 4/1995 | Nemoto et al. | 526/245 |
| 5,512,422 | 4/1996 | Hanawa et al. | 430/325 |
| 5,518,579 | 5/1996 | Katsuyama et al. | 156/659.11 |

*Primary Examiner*—Kathleen Duda
*Attorney, Agent, or Firm*—Banner & Witcoff, Ltd.

[57] ABSTRACT

Disclosed is a method of forming a pattern, comprising the steps of forming an underlying film on a semiconductor substrate, bringing a vapor of a neutralizer, which generates an acid upon exposure to light, into contact with the surface of the underlying film so as to form a primer layer, coating the primer layer with a chemical amplification resist, and selectively exposing the resist layer to light, followed by developing to form a resist pattern.

17 Claims, 3 Drawing Sheets

PATTERN FORMING METHOD

BACKGROUND OF THE INVENTION

The present invention relates to a pattern forming method.

In recent years, a chemical amplification resist containing an acid generator is widely used for fine processing of a semiconductor device. FIG. 1 shows that an underlying film 2 and a chemical amplification positive resist layer 3 are formed on a substrate 1. As shown in the drawing, an acid ($H^+$) is generated upon light exposure from the acid generator contained in the resist layer 3 so as to cause the solubilization of the resin, which is a main component of the resist, to be chemically amplified. On the other hand, when it comes to a chemical amplification negative resist, the acid generated upon light exposure permits the insolubilization of the resin to be chemically amplified. As a result, the sensitivity to exposure to light is improved.

However, it is known to the art that footing and undercut are observed in the pattern formed by selectively exposing a chemical amplification resist to light, followed by developing the light-exposed pattern.

In the case of a chemical amplification positive resist, the footing is caused by the diffusion of the base species present on the surface of the underlying film into the resist layer. To be more specific, when an underlying film is formed on a substrate, followed by forming a chemical amplification positive resist layer on the underlying film and subsequently exposing selectively the resist to light, an acid is generated from the acid generator contained in the resist. In this case, if the base species present on the surface of the underlying film 2 is diffused into the resist layer 3, the acid generated in the vicinity of the interface between the resist layer 3 and the underlying film 2 is neutralized. As a result, the resin forming the resist layer 3 is prevented from solubilizing in the vicinity of the interface between the resist layer 3 and the underlying film 2. It follows that the resist is left unremoved at the edge portion of the pattern obtained in the subsequent developing step, giving rise to the footing problem as shown in FIG. 2. The footing is also brought about in the case where the acid generated in the resist layer is diffused into the underlying film.

On the other hand, the undercut is generated by diffusion of the acid species present on the surface of the underlying film into the resist layer. To be more specific, if the acid present on the surface of the underlying film 2 is diffused into the resist layer 3 in the light-exposure step, an additional acid other than the acid generated from the acid generator contained in the resist layer 3 is present within the resist layer so as to cause the resin forming the resist layer 3 to be made soluble. As a result, the resist is removed excessively at the edge portion of the pattern in the subsequent developing step so as to give rise to the undercut problem, as shown in FIG. 3.

In the case of a chemical amplification negative resist, the mechanisms of the undercut and footing problems are opposite to those described above in conjunction with the chemical amplification positive resist. Specifically, the undercut and footing problems are brought about in the cases where the base and acid species are diffused from the underlying film into the resist layer, respectively.

It should also be noted that, where, for example, a chemical amplification positive resist layer is selectively exposed to light and, then, developed, a so-called T-topping, i.e., the problem that a basic contaminant within the atmosphere causes the resist to be left unremoved in an upper portion of the resist pattern, is observed in some cases.

If the footing or undercut takes place in the resist layer, it is impossible to pattern the underlying film in a predetermined size, making it difficult to apply a fine processing to a semiconductor device.

A measure for overcoming the above-noted difficulty is proposed in, for example, U.S. Pat. No. 5,372,914. It is proposed that a protective layer consisting of, for example, a thermosetting resin should be formed between a substrate and a resist layer in order to suppress the diffusion of a base species from the substrate. For suppressing the diffusion of a base species, however, it is necessary to coat the thermosetting resin in a sufficient thickness by means of spin coating, CVD, etc. Also, for removing the thermosetting resin from the space region, it is necessary in some cases to use an etchant differing from the developing solution of the resist. It follows that the pattern forming process is rendered complex in the case of forming a protective layer as proposed in the U.S. Patent quoted above.

BRIEF SUMMARY OF THE INVENTION

An object of the present invention is to provide a pattern forming method which permits suppressing the footing and undercut problems of the resist layer without making the pattern-forming steps complex.

According to a first aspect of the present invention, there is provided a method of forming a pattern, comprising the steps of forming an underlying film on a semiconductor substrate; bringing a vapor of a neutralizer, which generates an acid upon exposure to light, into contact with the surface of the underlying film so as to form a primer layer; coating the primer layer with a chemical amplification resist; and selectively exposing the resist layer to light, followed by developing thereby forming a resist pattern.

The first method is effective in the case of using an underlying film containing a base species such as a BPSG (borophospho silicate glass) film, a silicon nitride film or a titanium nitride film.

According to a second aspect of the present invention, there is provided a method of forming a pattern, comprising the steps of forming an underlying film on a semiconductor substrate; bringing a vapor of a neutralizer which generates a nucleophile upon exposure to light, or a vapor of a neutralizer which is weakly basic by itself, into contact with the surface of the underlying film so as to form a primer layer; coating the primer layer with a chemical amplification resist; and selectively exposing the resist layer to light, followed by developing thereby forming a resist pattern.

The second method is effective in the case of using an underlying film containing an acid species or generating an acid species upon exposure to light such as an organic anti-reflective coating.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
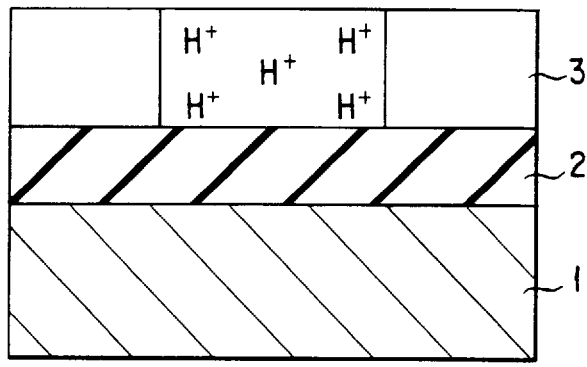
FIG. 1 is a cross sectional view showing the state after selective exposure of a conventional chemical amplification positive resist layer to light.
Figure 2:
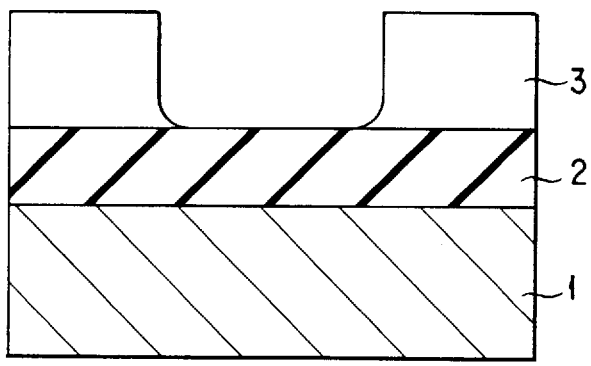
FIG. 2 is a cross sectional view showing the state after development of a conventional chemical amplification positive resist layer.
Figure 3:
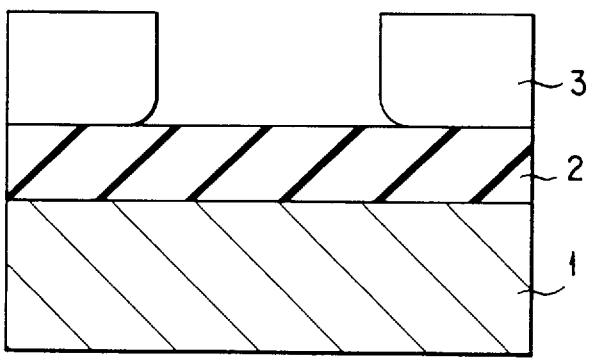
FIG. 3 is a cross sectional view also showing the state after development of a conventional chemical amplification positive resist layer.

In a first method of the present invention, a vapor of a neutralizer is brought into contact with the surface of an underlying film containing a base species such as a BPSG film, a silicon nitride film or a titanium nitride film. The neutralizer, which acts as an acid generator, consists of low molecular weight compounds which generate acids upon exposure to light. It is desirable for the neutralizer to consist of a low molecular weight compound having a molecular weight of 150 or less and capable of being evaporated under temperatures falling within a range of between room temperature and 150° C. under atmospheric pressure. To be more specific, the neutralizer which acts as an acid generator includes, for example, 2-sulfonylbutane and methyl methacrylate.

In the first method of the present invention, a vapor of the neutralizer is brought into contact with the surface of an underlying film so as to form a primer layer of the neutralizer. In this step, the neutralizer is adsorbed on the surface of the underlying film by means of hydrogen bond or van der Waals force to form a layer consisting of several molecules in a thickness direction. In this fashion, the primer layer of the neutralizer can be formed easily.

The primer layer of the neutralizer is coated with a chemical amplification resist. It should be noted that the primer layer of the neutralizer before exposure to light does not perform a chemical reaction with the chemical amplification resist layer formed thereon. If the chemical amplification resist layer is exposed to light, an acid is generated from the acid generator contained in the resist layer. At the same time, an acid is also generated from the primer layer of the neutralizer. The mechanism of the acid generation from the neutralizer such as 2-sulfonylbutane or methyl methacrylate is as denoted by chemical formula (1) or (2) given below:

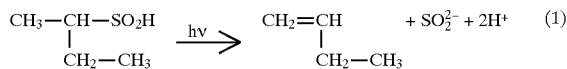 (1)

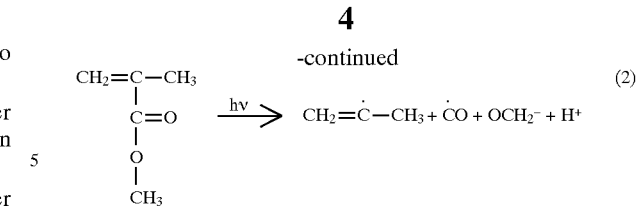

As a result, the base species diffused from the underlying film is neutralized by the acid generated within the primer layer of the neutralizer. Also, the acid generated from the acid generator within the chemical amplification resist layer is not neutralized by the base species diffused from the underlying film. It follows that the footing at the interface between the underlying film and the resist layer can be prevented in the step of developing the resist. It should also be noted that the neutralizer used in the present invention consists of a low molecular weight compound, with the result that the primer layer of the neutralizer can be removed easily by the developing solution of the resist.

In a second method of the present invention, a vapor of a neutralizer is brought into contact with the surface of the underlying film containing an acid species, e.g., an organic anti-reflective coating. The neutralizer consists of a low molecular weight compound which generates a nucleophile upon exposure to light or a low molecular weight compound which is weakly basic by itself. It is desirable for the neutralizer used in the second method to consist of a low molecular weight compound having a molecular weight of 150 or less and capable of being evaporated under temperatures falling within a range of between room temperature and 150° C. under atmospheric pressure. Specifically, the neutralizer used in the second method of the present invention includes, for example, acrylamide and pyridine.

In the case of using the neutralizer described above, a primer layer of the neutralizer can be formed easily by simply bringing a vapor of the neutralizer into contact with the surface of the underlying film. Also, where the primer layer of the neutralizer is coated with a chemical amplification resist, the resist layer before exposure to light is not reacted with the primer layer of the neutralizer. If the chemical amplification resist layer is exposed to light, an acid is generated from the acid generator contained in the resist layer. At the same time, a nucleophile is generated from, for example, acrylamide used as the neutralizer. The mechanism of the nucleophile generation from acrylamide is as denoted by chemical formula (3) given below:

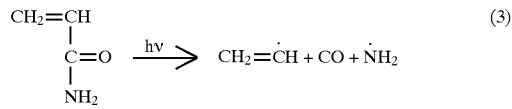 (3)

Incidentally, pyridine,

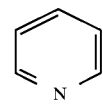

is weakly basic by itself.

As a result, the acid species diffused from the underlying film is neutralized by the neutralizer. Also, the solubilization of the resin forming the chemical amplification resist is not promoted by the acid species diffused from the underlying film. It follows that, when the resist is developed, it is possible to prevent the undercut occurrence at the interface between the underlying film and the resist layer. It should also be noted that the neutralizer used in the present invention consists of a low molecular weight compound. Therefore, the primer layer of the neutralizer can be easily removed by the developing solution of the resist.

The chemical amplification resist used in the present invention may be either positive or negative. The typical chemical amplification positive resist for exposure to DUV (deep ultraviolet) light includes, for example, a two-component system consisting of poly (tert-BOC styrene) having a chemical structure of formula (4) given below, of which dissolution to an alkaline developer is inhibited, and triarylsulfonium salt ($Ph_3S^+SbF_6^-$) having a chemical structure of formula (5) given below, which is an acid generator:

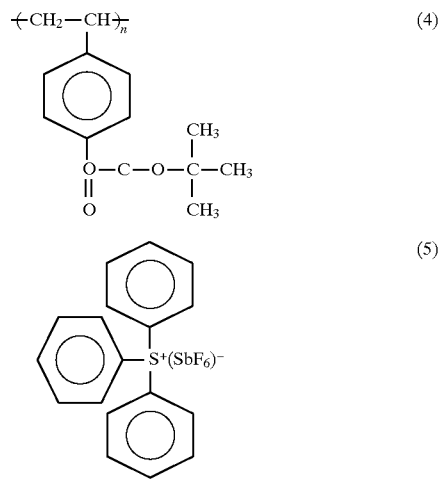

On the other hand, the typical chemical amplification negative resist for exposure to DUV light includes, for example, a two-component system consisting of 4-acetoxymethylstyrene 4-hydroxystyrene copolymer having a chemical structure of formula (6) given below, which is an alkali-soluble resin and acts as a photo-crosslinking agent, and the triarylsulfonium salt ($Ph_3S^+SbF_6^-$) having a chemical structure of formula (5) given above, which is an acid generator:

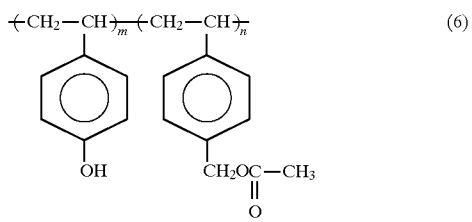

In each of the chemical amplification positive and negative resists exemplified above, the acid generator performs a photochemical reaction in the presence of a hydrogen donor HY, e.g., $H_2O$ as follows:

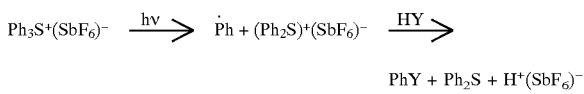

The method of the present invention can also be applied to the case where a primer layer and a chemical amplification resist layer are formed on a substrate, followed by etching the substrate. Also, for preventing T-topping caused by an acidic contaminant within the atmosphere, a primer layer of a neutralizer consisting of a low molecular weight compound which generates a nucleophile upon exposure to light or a low molecular weight compound which is weakly basic by itself may be formed on the chemical amplification resist layer.

EXAMPLES

Figure 4:
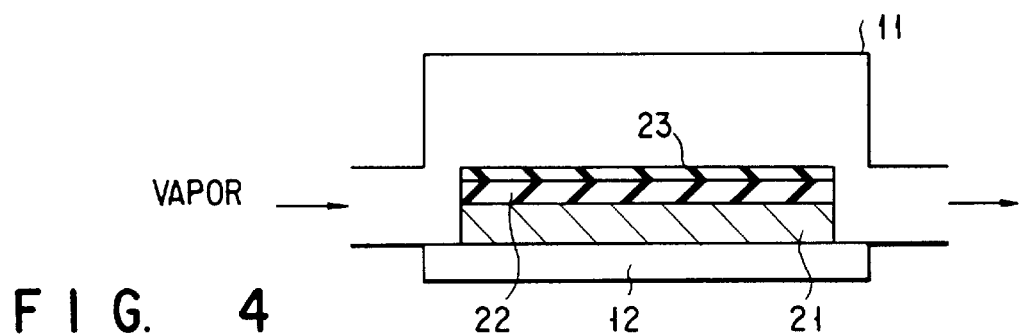
FIG. 4 is a cross sectional view showing the construction of an apparatus for applying a priming treatment in a method of the present invention.

In the following Examples, a primer layer of a neutralizer is formed by using an apparatus shown in FIG. 4. As shown in the drawing, the apparatus comprises a priming chamber 11 equipped with a temperature control plate 12. An object to be treated consisting of a silicon substrate 21 and an underlying film 22 formed on the surface of the substrate 21 is disposed on the temperature control plate 12. A vapor of a neutralizer is introduced into the priming chamber 11 so as to form a primer layer 23 of the neutralizer on the surface of the underlying film 22.

Example 1

Figure 5A:
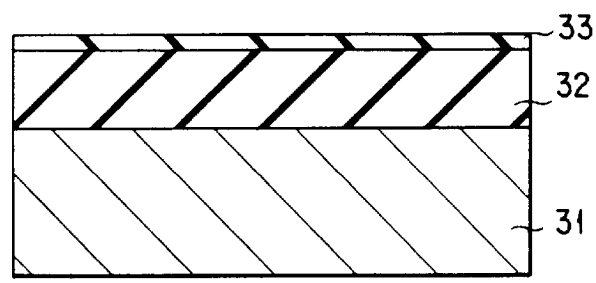
FIGS. 5A to 5C are cross sectional views collectively showing how to form a pattern of a chemical amplification positive resist by a first embodiment of the method of the present invention.

As shown in FIG. 5A, a BPSG film 32 is formed as an underlying film on a silicon substrate 31, followed by treating the surface of the BPSG film 32 with OAP (trade name of hexamethyldisilazane manufactured by Tokyo-Oka Kogyo K.K.) for 2 minutes at room temperature. The treatment with OAP is intended to make the surface of the BPSG film hydrophobic so as to promote the adhesiveness of a resist. The substrate is placed in the priming chamber 11. Under this condition, 2-sulfonyl butane is evaporated by heating to 150° C. The resultant vapor is introduced into the priming chamber 11 for treating a surface region of the BPSG film 32 for 2 minutes so as to form a primer layer 33 on the surface of the BPSG film 32.

Figure 5B:
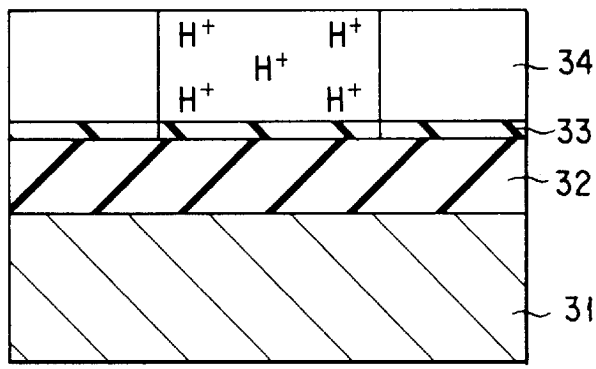

In the next step, the primer layer 33 is coated with APEX-E (trade name of a chemical amplification positive resist manufactured by Shipley Inc.) to form a resist layer 34 in a thickness of 0.85 μm, as shown in FIG. 5B. Then, the substrate is put on a hot plate so as to perform a post-apply baking (PAB) at 90° C. for 90 seconds, followed by selectively exposing the resist layer 34 to a KrF eximer laser light (NA=0.6, σ=0.75) using an exposure apparatus S201A (trade name of a step-and-scan reduction projecting exposure apparatus manufactured by Nikon K.K.) to form a line-and-space pattern of 0.25 μm. Immediately after the selective exposure to the eximer laser light, the resist layer 34 is subjected to a post-exposure baking (PEB) at 90° C. for 90 seconds on a hot plate. In this step, an acid is generated from the acid generator contained in the exposed region of the resist layer 34. At the same time, an acid is also generated from 2-sulfonylbutane of the primer layer 33. On the other hand, a basic substance (mainly amine) is diffused from the underlying BPSG film 32 and HMDS, which is an adhesiveness promotor, toward the resist layer 34. However, the basic substance is neutralized by the acid generated from 2-sulfonylbutane of the primer layer 33.

Figure 5C:
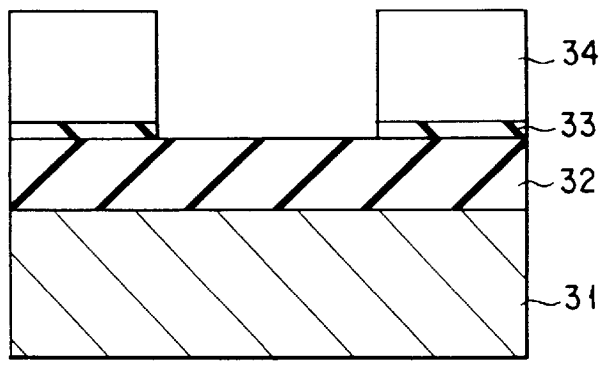

Finally, the substrate after the light-exposure step is developed at 23° C. for 90 seconds using 0.21N of tetramethylammonium hydride (TMAH) as an organic alkaline developing solution. As shown in FIG. 5C, the resist layer 34 is prevented from bearing footing so as to markedly improve the dimensional accuracy of the patterned resist layer 34.

Example 2

Figure 6A:
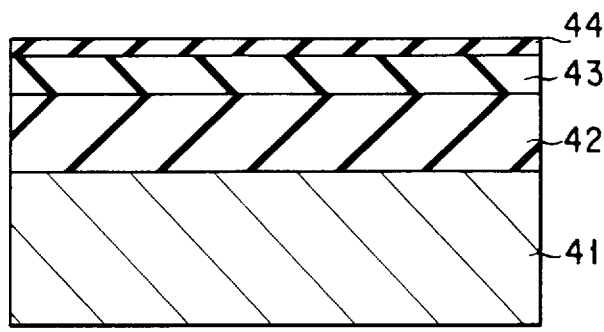
FIGS. 6A to 6C are cross sectional views collectively showing how to form a pattern of a chemical amplification positive resist by a second embodiment of the method of the present invention.

As shown in FIG. 6A, a BPSG film 42 is formed as an underlying film on a silicon substrate 41, followed by forming an organic anti-reflective coating 43 consisting of CD-9 (manufactured by Brewer Science Ltd.) in a thickness of 0.09 μm on the BPSG film 42 and subsequently baking the organic anti-reflective coating 43 at 225° C. for 90 seconds. Then, the substrate is placed in the priming chamber 11. Under this condition, acrylamide is evaporated by heating to 150° C. The resultant vapor is introduced into the priming chamber 11 for treating a surface region of the organic anti-reflective coating 43 for 2 minutes so as to form a primer layer 34 on the surface of the organic anti-reflective coating 43.

Figure 6B:
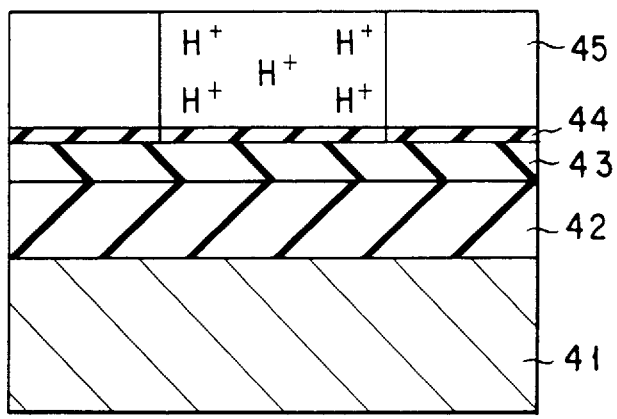

In the next step, the primer layer 44 is coated with APEX-E referred to previously to form a chemical amplification positive resist layer 34 in a thickness of 0.85 µm, as shown in FIG. 6B. Then, the substrate is put on a hot plate so as to perform a post-apply baking (PAB) at 90° C. for 90 seconds, followed by subjecting the resist layer 34 to a line-and-space exposure of 0.25 µm using an exposure apparatus equal to that used in Example 1. Immediately after the light-exposure step, the resist layer 34 is subjected to a post-exposure baking (PEB) at 90° C. for 90 seconds on a hot plate. In this step, an acid is generated from the acid generator contained in the exposed region of the resist layer 45. At the same time, a base is generated from acrylamide contained in the primer layer 44. On the other hand, an acidic substance is diffused from the underlying organic anti-reflective coating 43 toward the resist layer 34. However, the acidic substance is neutralized by the base generated from acrylamide contained in the primer layer 44.

Figure 6C:
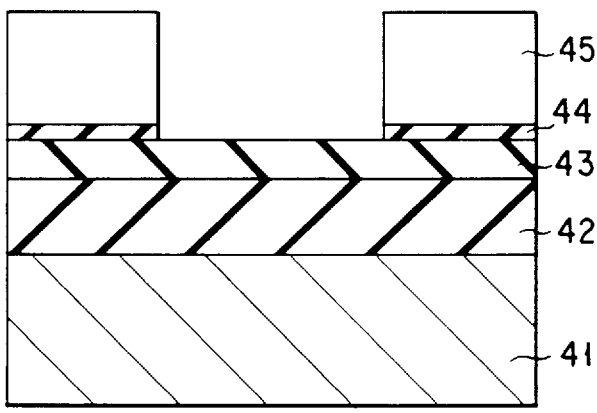

Finally, the substrate after the light-exposure step is developed at 23° C. for 90 seconds using 0.21N of TMAH as an organic alkaline developing solution. As shown in FIG. 6C, the resist layer 45 is prevented from bearing undercut so as to markedly improve the dimensional accuracy of the patterned resist layer 45.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of forming a pattern, comprising the steps of:
   forming an underlying film on a semiconductor substrate;
   bringing a vapor of a first neutralizer, into contact with the surface of the underlying film so as to form a primer layer of the first neutralizer, the first neutralizer generating an acid upon exposure to light and neutralizing a base species;
   coating the primer layer with a chemical amplification resist; and
   selectively exposing the resist layer to light, followed by developing to form a resist pattern.

2. The method of forming a pattern according to claim 1, wherein said underlying film is formed of a material containing a base species.

3. The method of forming a pattern according to claim 1, wherein said underlying film is formed of a compound selected from the group consisting of a borophospho silicate glass film or a titanium nitride film.

4. The method of forming a pattern according to claim 1, wherein said underlying film is treated with hexamethyl disilazane to make a surface region of the underlying film hydrophobic before forming the primer layer of the first neutralizer on the surface of said underlying film.

5. The method of forming a pattern according to claim 1, wherein said neutralizer has a molecular weight of 150 or less.

6. The method of forming a pattern according to claim 1, wherein a vapor of said neutralizer is generated at temperatures within a range of between room temperature and 150° C. under atmospheric pressure.

7. The method of forming a pattern according to claim 1, wherein said neutralizer is selected from the group consisting of 2-sulfonylbutane and methyl methacrylate.

8. The method of forming a pattern according to claim 1, wherein said chemical amplification resist is a positive resist.

9. The method according to claim 1, further comprising a step of bringing a vapor of a second neutralizer into contact with the surface of said resist layer so as to form a primer layer of the second neutralizer, the second neutralizer generating a nucleophile upon exposure to light and neutralizing an acid species or the second neutralizer being weakly basic and neutralizing an acid species by itself.

10. A method of forming a pattern, comprising the steps of:
    forming an underlying film on a semiconductor substrate;
    bringing a vapor of a first neutralizer into contact with the surface of the underlying film so as to form a primer layer of the first neutralizer, the first neutralizer generating a nucleophile upon exposure to light and neutralizing an acid species or the first neutralizer being weakly basic and neutralizing an acid species by itself;
    coating the primer layer with a chemical amplification resist; and
    selectively exposing the resist layer to light, followed by developing to form a resist pattern.

11. The method of forming a pattern according to claim 10, wherein said underlying film is formed of a material containing an acid species.

12. The method of forming a pattern according to claim 11, wherein said underlying film is formed of an organic anti-reflective coating.

13. The method of forming a pattern according to claim 10, wherein said neutralizer has a molecular weight of 150 or less.

14. The method of forming a pattern according to claim 10, wherein a vapor of said neutralizer is generated at temperatures within a range of between room temperature and 150° C. under atmospheric pressure.

15. The method of forming a pattern according to claim 10, wherein said neutralizer is selected from the group consisting of acrylamide and pyridine.

16. The method of forming a pattern according to claim 10, wherein said chemical amplification resist is a positive resist.

17. The method of forming a pattern according to claim 10, further comprising a step of bringing a vapor of a second neutralizer into contact with the surface of said resist layer so as to form a primer layer of the second neutralizer, the second neutralizer generating a nucleophile upon exposure to light and neutralizing an acid species or the second neutralizer being weakly basic and neutralizing an acid species by itself.

* * * * *